United States Patent [19]
Knight et al.

[11] Patent Number: 4,764,926
[45] Date of Patent: Aug. 16, 1988

[54] INTEGRATED CIRCUITS

[75] Inventors: William L. Knight, Hampshire; Mark Paraskeva, Soton; David F. Burrows, Hampshire, all of United Kingdom

[73] Assignee: Plessey Overseas Limited, Ilford, England

[21] Appl. No.: 807,913

[22] Filed: Dec. 11, 1985

[30] Foreign Application Priority Data

Dec. 21, 1984 [GB] United Kingdom ................. 8432533

[51] Int. Cl.⁴ ............................................ G01R 31/28
[52] U.S. Cl. ....................................... 371/25; 371/27
[58] Field of Search ........... 324/73 R, 73 AT, 73 PC; 371/15, 24, 27, 25

[56] References Cited

U.S. PATENT DOCUMENTS

| | | | |
|---|---|---|---|
| 3,261,695 | 9/1973 | Eichelberger | 371/25 |
| 4,055,754 | 10/1977 | Chesley | 324/73 R |
| 4,063,080 | 12/1977 | Eichelberger et al. | 324/73 AT |
| 4,191,996 | 3/1980 | Chesley | 324/73 AT |
| 4,244,048 | 1/1981 | Tsui | 324/73 R |
| 4,423,509 | 12/1983 | Feisel | 324/73 AT |
| 4,435,806 | 3/1984 | Segers et al. | 324/73 AT |
| 4,498,172 | 2/1985 | Bhavsor | 371/15 |
| 4,503,386 | 3/1985 | Das Gupta et al. | 324/73 R |
| 4,519,078 | 5/1985 | Komonytsky | 324/73 R |
| 4,587,481 | 5/1986 | Lischke et al. | 324/73 PC |

FOREIGN PATENT DOCUMENTS

| | | |
|---|---|---|
| 0108255 | 5/1984 | European Pat. Off. . |
| 0108256 | 5/1984 | European Pat. Off. . |
| 2121997 | 1/1984 | United Kingdom ................. 371/15 |

OTHER PUBLICATIONS

"In-Situ Testability Design", by Tsui, IEEE Proceed., vol. 70, #1, 1/82, pp. 59–78.
"Generation of Internal Test Signals", by Bodner et al., IBM Tech. Disc. Bull., vol. 17, #8, 1/75, p. 2396.
"Self-Testing Scheme Using Shift Register Latches", by Bottorff et al., IBM Tech. Disc. Bull., vol. 25, #10, 3/83, pp. 4958–4960.
"A Hardware Approach to Self-Testing of Large Programmable Logic Arrays", by Daehn et al., IEEE Trans. on Comp., vol. C-30, #11, 11/81, pp. 829–833.
IBM Technical Disclosure Bulletin, vol. 25, No.-10, Mar. 1983, pp. 5124–5127, F. Tsui; "In-System In-Isolation Module Testing Design".
Proceedings of the IEEE, vol. 71, No. 1, Jan. 1983, pp. 98–112; T. W. Williams "Design for Testability—A Survey", 8078 IEEE Proc., vol. 71, #1, 1/83.

Primary Examiner—Reinhard J. Eisenzopf
Assistant Examiner—W. Burns
Attorney, Agent, or Firm—Michael F. Oglo; Julian C. Renfro

[57] ABSTRACT

An integrated circuit having a built-in self test facility, the integrated circuit being partitioned into a number of sub-circuits each of which comprises a combinatorial logic circuit and a register. The sub-circuits are coupled together so that each combinatorial logic circuit has its inputs coupled to at least one register, has its outputs coupled to at least one register, and the output of the overall integrated circuit is taken from one or more registers. Each register has its fucntional mode controlled by predetermined signals to an associated local decoder, the functional modes of the registers being selected to initiate a test operation for the testing of the integrated circuits.

17 Claims, 7 Drawing Sheets a) FULL 'BILBO' REGISTER b) SEPERATE REGISTER MODE (AB=10, C=X)

c) SCAN PATH MODE (AB=01, C SELECTS SCAN IN)

d) TEST PATTERN GENERATOR MODE (AB=01, C SELECTS FEEDBACK)

e) PARALLEL SIGNATURE ANALYSER MODE (AB=11, C SELECTS FEEDBACK)

INTEGRATED CIRCUITS

BACKGROUND TO THE INVENTION

The present invention relates to integrated circuits and more particularly to an integrated circuit having a built-in self test design.

The ease with which an integrated circuit can be tested is dependent on the controllability and observability of each of its components. A number of testing techniques have previously been proposed which have as their objective the increase in the controllability and observability of each of the components in the integrated circuit. The proposed techniques fall broadly into two groups known respectively as "ad hoc" and "structured" testing methods.

One "ad hoc" method involves the addition of extra test points to the integrated circuit. By means of suitable computer programs it is possible to calculate the number and sequence of test signals to the inputs necessary to test each gate in the circuit as well as determining the best positions to insert test points. A practical implementation however on a chip may involve the use of numerous multiplexers to ease the external connection problem.

Another "ad-hoc" method is "partitioning", where the circuit is broken down into a number of more manageable blocks. These blocks are then connected to the input and output pins to facilitate the testing of each block individually. Problems arise with this method when it is desired to test components of very large scale integrated circuits as design difficulties may arise when attempting to choose and gain access to the partitions.

In the case of "structured" testing methods, the testability measures form an active part of the system design. An example in this field has been the "Scan Path" and "LSSD" (Level Sensitive Scan Design) techniques, where a "scan mode" input configures all the register elements in a chip together to form a long shift register. By adding, "scan in" and "scan out" pins, the complete state of the chip can be determined or defined.

To use the scan path technique, a typical sequence would involve first "scanning in" a specific state. One or more clock pulses would then be applied while the circuit is in "normal" mode to actually test its operation. The next "starting state" would then be "scanned in" as the resulting state was being "scanned out" and checked against the expected result.

The main problem with this technique is that it is generally necessary to set up the initial conditions for a large number of tests. Whereas the test itself may only take one clock cycle, in order to "scan in" an initial state, and/or "scan out" a result may take as many clock cycles as there are registers in the whole circuit. Since it is necessary to stop the normal operation while internal states are being scanned in or out, continuous real-time testing is not possible. Furthermore expensive test equipment is still required to provide predetermined test patterns to the inputs of the circuit.

The LSSD variation involves the use of "level sensitive" registers which appear transparent for one particular clock level. Two such registers and a two phase clock are necessary to implement the scan path shift register.

Proposals have also been made previously for the self-testing of integrated circuits. One of these techniques, described later with reference to FIGS. 1 and 2 of the accompanying drawings, is known as Built-In Logic Block Observation (BILBO) and by using BILBO registers incorporates the concepts of both the Scan Path described above and the concept of a Signature Analysis technique. The BILBO registers are used to test a combinatorial logic circuit by which is meant a circuit whose output signals are always the same for the same combination of input signals. Such tests can be performed at full speed.

BILBO registers have also been used to test circuits that include internal registers. The internal registers form a Scan-path which is loaded with pseudo-random patterns by means of a BILBO register on the Scan-Path input. As with the normal Scan-Path techiniques, the circuit is then switched into normal operation for one or more clock cycles. The resulting state is then scanned into a further BILBO register which computes a Signature from the serial stream of data from the Scan-path as a new pseudo-random state is being scanned in. This technique retains the problems of long test times characteristic of normal scan path techniques, because the complete state of an integrated circuit must still be scanned out and a new state scanned in a very large number of times for a thorough test to be carried out. Self-testing circuitry has been proposed in European Patent Application Nos. 0108255 and 0108256. The circuitry described employs register elements operable in the conventional modes of "normal operation" and "scan path" (LSSD type) as well as a "self test" mode in which they perform a signature analysis upon the output of combinatorial logic that feeds the register elements.

European Patent Application No. 0108256 teaches circuitry in which during operation each register element on a chip supplies test patterns to "down-stream" logic simultaneously as performing a signature analysis upon the output from "up-stream" logic. European Patent Application No. 0108255 teaches circuitry in which a plurality of such chips are used to form a larger system with built-in test facilities. To this end, a separate pseudo random test pattern generator and a separate signature analyser are added to the system to respectively generate the first pseudo-random patterns (at the start of the scan path) and analyse the signals (at the end of the scan path) of each of the component chips. Additional test control circuitry is also required to perform a test on the system.

The register elements in a particular chip in the circuitry described in European patent application Nos. 0108256 and 0108255 are always operated in the same mode as each other. Thus signature analysis data from "up-stream" logic is used as test pattern data to "down-stream" logic. It would be necessary therefore to run expensive computer simulation programs to test the fault coverage. If the fault coverage is found to be unacceptably low then the only recourse would be to redesign the circuit. It would then be necessary to repeat the computer simulation process to ascertain whether or not the fault coverage had been improved. Furthermore, the need for external equipment both to control the test and to check the output during the test is extremely expensive.

The present invention strives to provide integrated circuits (which may include many internal registers) with a built-in self test facility where the self test can be designed to be completed within any reasonable given time and still guarantee a very high fault coverage without the necessity for fault simulation.

SUMMARY OF THE INVENTION

According to the present invention there is provided an integrated circuit having a built-in self test design, the integrated circuit comprising a plurality of combinatorial logic circuits coupled to a plurality of functional elements, the functional elements being responsive to signals for selectively controlling the functional modes of each functional element and for selectively controlling predefined groups of functional elements to operate in different functional modes to effect test operations to the combinatorial logic circuits.

In a preferred embodiment of the present invention the integrated circuit is partitioned into two or more sub-circuits, each sub-circuit comprising at least one combinatorial logic circuit and at least one functional element, the sub-circuits being arranged so that each combinatorial logic circuit has coupled to its input at least one functional element, the arrangement being such that a functional element which is coupled to both the input of one combinatorial logic circuit and to the output of a second combinatorial logic circuit has its functional mode controllable selectively to generate when required a required pattern sequence of signals to the input of said one combinatorial logic circuit, and to analyse when required the output from said second combinatorial logic circuit consequent upon a pattern sequence of signals being fed to the input of said second combinatorial logic circuit.

The functional mode of each functional element is selectively controlled by either a decoder means which is responsive to signals from a test controller or selectively controlled directly from the test controller. The test controller and/or the decoder means may be formed as an integral part of the integrated circuit design or may be external to the integrated circuit. In a preferred embodiment the test controller and/or the decoder means are formed as an integral part of the integrated circuit.

The decoder means may take a variety of different forms in different embodiments of the present invention such that in operation a predetermined sequence of input signals to the decoder means generates a predetermined sequence of output signals. In one embodiment of the present invention the decoder means comprises a plurality of test signal decoders each of which is coupled to a respective functional element or a respective group of functional elements, each test signal decoder being responsive to a predetermined sequence of input signals from the test controller for controlling the functional modes of the functional element or group of functional elements. Conveniently, the test signal decoders are connected in parallel via a test bus to the test controller.

One or more of the sub-circuits may be provided with an additional functional element the output of which is coupled to the input or inputs of the combinatorial logic circuit or circuits in said one or more sub-circuits, the input of the additional functional element being coupled to an input of the integrated circuit.

In a preferred embodiment the sub-circuits are coupled together in a manner to allow simultaneous testing of two or more of the combinatorial logic circuits.

In one embodiment the functional element comprises one or more flip-flops and advantageously the flip-flops may together form a register element.

In a further embodiment means are provided for feeding signals indicative of the functional characteristics of the combinatorial logic circuits to an output of the integrated circuit, said means feeding the signals to the output of the integrated circuit via a data route which passes through all of the functional elements.

In a preferred embodiment the pattern sequence of signals is exhaustive such that all possible combinations of input patterns are applied. Conveniently the pattern sequence of signals is a pseudo-random pattern of signals.

Desirably the number of inputs to each combinatorial logic circuit is less than $\log_2 (T \times F)$ where T is the maximum available time for testing and F is the applied clock frequency.

In a preferred embodiment means are provided for selecting different configurations for the functional elements for different stages of a self test of the integrated circuit.

Advantageously the means for selecting the different configurations for the functional elements comprises feedback means associated with one or more of the functional elements and data selecting means for selectively connecting the feedback means to an input of a functional element. In a preferred embodiment the feedback means includes an Exclusive NOR gate and the data selecting means is a multiplexer.

The present invention also provides an integrated circuit having a built-in self test design, the integrated circuit comprising a plurality of sub-circuits each of which comprises at least one combinatorial logic circuit coupled to at least one functional element, the functional elements being responsive to signals for selectively controlling simultaneously two or more of the functional elements into different functional modes to effect a test phase to part of the integrated circuit, means being provided for effecting sequentially a plurality of such test phases to parts of the integrated circuit to provide test data representative of the functional characteristics of substantially all the combinatorial logic circuits and functional elements in the integrated circuit.

According to the present invention there is also provided a method of testing an integrated circuit comprising a plurality of combinatorial logic circuits coupled to functional elements the functional modes of operation of which are controlled by decoder means responsive to signals from a test controller, the method comprising the steps of feeding the signals to the decoder means, feeding first control signals from the decoder means to one or more of the functional elements to control the or each functional element into a test pattern generator mode to feed a pattern of test signals to one or more of the combinatorial logic circuits, feeding second control signals from the decoder means to one or more of the other functional elements to control the or each of the other functional elements into a signature analysis mode to receive output signals from the or each combinatorial logic circuit which signals are representative of the functional characteristics of the or each combinatorial logic circuit, and feeding the resulting data stored in the functional elements to an output of the integrated circuit for comparison with data representative of the correct functioning of the or each combinatorial logic circuit.

BRIEF DESCRIPTION OF THE DRAWINGS

The present invention will be described further, by way of example with reference to the accompanying drawings in which:

FIG. 1a illustrates a known circuit for a BILBO register;

FIGS. 1b, 1c, 1d and 1e are equivalent circuits illustrating the modes of operation of the BILBO register of FIG. 1a;

A known BILBO technique for built in test integrated circuits is based in the concept of reconfiguring registers to appear as either a pseudo-random number generator, or a (parallel) signature analyser. As these registers are generally "taken" from the original circuit, they must also be capable of reverting back to simple registers, and if a scan path is implemented they must be capable of forming a shift register as well.

Figure 1:
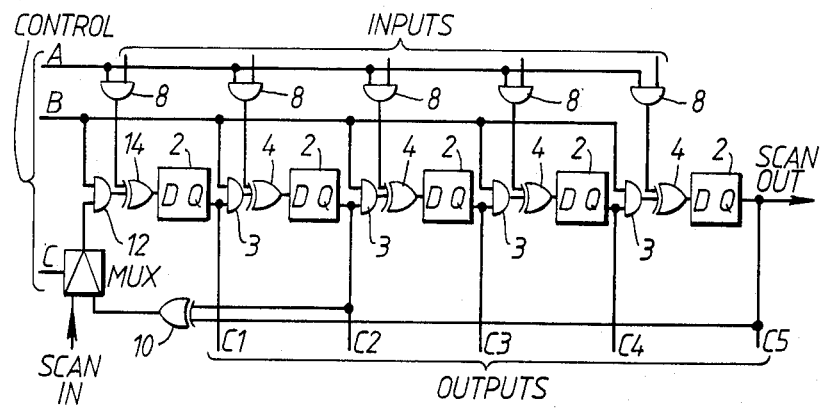
Figure 1:
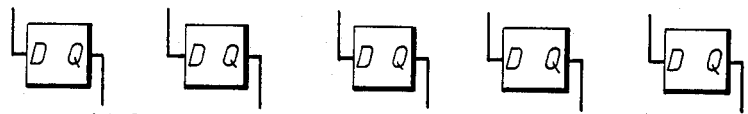
Figure 1:
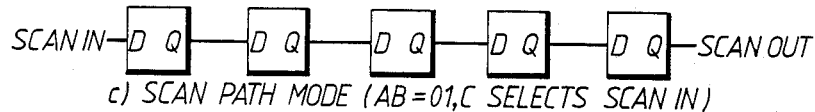
Figure 1:
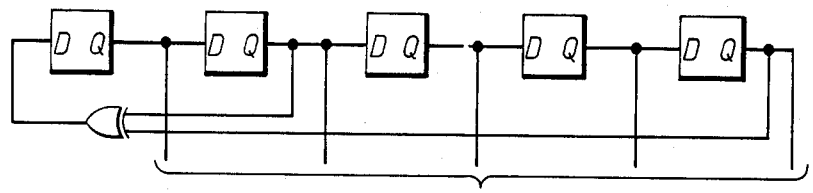
Figure 1:
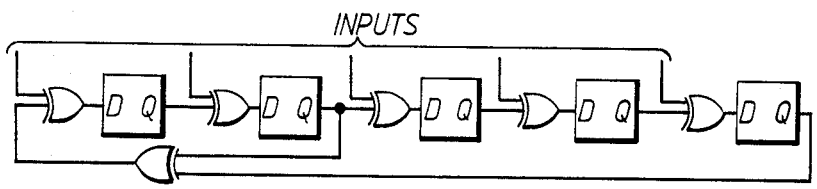

A circuit capable of performing the above is shown in FIG. 1a and the equivalent circuit for each of the modes of operation shown in FIGS. 1(b-e).

FIG. 1a shows a five bit BILBO register of known type comprising five D-type flip-flops 2 coupled in series, the input of the first D-type flip-flop 2 in the series being connected to the output of an Exclusive-OR gate 14 and the inputs of each of the other four D-type flip-flops 2 in the series being connected similarly to the output of a respective Exclusive-OR 4. One of the inputs of the Exclusive-OR gate 14 is connected to the output of an AND gate 12 and similarly one of the inputs of each of the Exclusive-OR gates 4 is connected to the output of a respective AND gate 3. The other input of each of Exclusive-OR gates 14, 4 is connected to the output of a respective AND gate 8. The inputs of each of the AND gates 8 are connected respectively to a common line A and to a respective output of a combinatorial logic network (not shown). The inputs of each of the AND gates 3 are connected respectively to a common line B and the output of one of the flip-flops 2, each of the inputs of the AND gate 12 being connected respectively to the common line B and the output of a multiplexer MUX.

The outputs of the second and fifth D-type flip-flops 2 in the series are connected to the inputs of an Exclusive-OR gate 10 the output of which is coupled to the input of the first D-type flip-flop 2 via the multiplexer MUX, the AND gate 12 and the Exclusive-OR gate 14. In practice only certain combinations of outputs from the D-type flip-flops 2 can be tapped for these feedback connections if it is desired to provide a maximal length test pattern when the BILBO register is in its test pattern generator mode. These combinations of outputs are known in the electronic field and are dependent on the number of D-type flip-flops 2 in the BILBO register.

The values of the signals on control lines A and B control different functions that the BILBO register can perform. SCAN-IN is the scan-in input to the BILBO register, SCAN-OUT is the scan-out for the BILBO register and the five output values for the D-type flip-flops 2 appear at the five output lines $C_1$, $C_2$, $C_3$, $C_4$ and $C_5$. The output line $C_5$ also serves as the SCAN OUT.

There are five modes of operation for the BILBO register. The first is illustrated in FIG. 1b with the signals on the lines A and B equal to 1 and 0 respectively. This is a mode of operation in which the input values from the combinational logic network are loaded into the D-type flip-flops 2, and the outputs on the five lines $C_1$, $C_2$, $C_3$, $C_4$ and $C_5$ are available for system operation. The BILBO register behaves therefore with a normal register function.

In the second mode of operation, illustrated in FIG. 1c, the values of the control lines A and B are 0 and 1 respectively and a control line C to the multiplexer MUX is set so as to connect the scan-in input to the input of the AND gate 12, through the multiplexer MUX.

In this mode the BILBO register behaves as a linear shift register, that is in a scan path mode.

In FIG. 1d the values on the control lines A and B are 0 and 1 respectively and the control line C to the multiplexer MUX is set so as to connect the feedback line to the input of the AND gate 12. In this third mode, the BILBO register behaves as a pseudo-random number generator useful in providing test patterns for a combinatorial logic network coupled to its output lines $C_1$, $C_2$, $C_3$, $C_4$ and $C_5$, it is therefore referred to as being in its test pattern generator mode.

In FIG. 1e the values on the control lines A and B are both 1 and the control line C to the multiplexer MUX is set to connect the feedback line to the input of the AND gate 12. In this fourth mode the BILBO register behaves as a linear feedback shift register with multiple linear inputs. If predetermined input signals are fed to a correctly functioning combinatorial logic network and the outputs of the combinatorial logic network are connected to the inputs of the BILBO register in this mode then after a large number of clocks there will be a characteristic signature left in the BILBO register for that correctly functioning logic network. Hence the mode is referred to as a signature analyser mode. The signature of the combinational logic network can be off-loaded from the BILBO register to the SCAN-OUT output by changing to the Scan Path Mode of FIG. 1c, that is by changing the values on the control lines A and B to 0 and 1 respectively.

In the fifth mode of operation the values on the control lines A and B are both set at 0 in which mode the BILBO register of FIG. 1a executes a synchronous reset.

Figure 2:
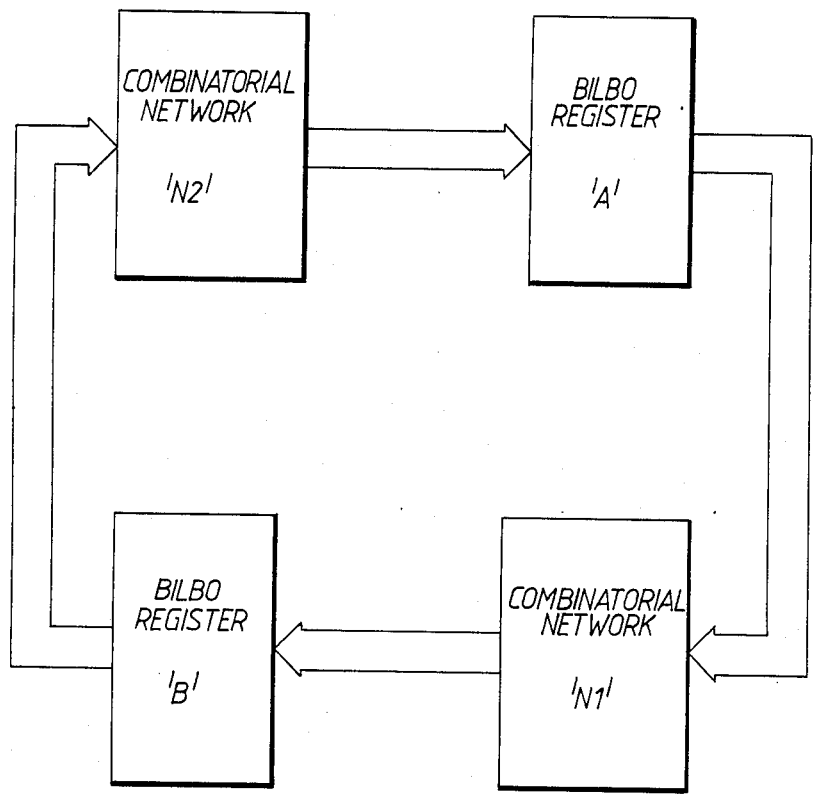
FIG. 2 is a block diagram illustrating the use of BILBO registers of FIG. 1a in a circuit to test combinatorial networks.

One known technique of testing combinatorial networks using BILBO registers, like that in FIG. 1a, is shown in FIG. 2. The testing of the circuit networks is performed in two steps. During the first step a BILBO register A is switched into its test pattern generation mode, and a BILBO register B into its signature analysis mode, enabling a combinatorial network N1 to be tested after which the signature in the BILBO register B is checked. During the second step the BILBO register B is switched into its test pattern generation mode, and the BILBO register A into its signature analysis mode, enabling a similar test to be performed on the combinatorial network N2.

DESCRIPTION OF A PREFERRED EMBODIMENT

The design of an integrated circuit having a built-in test facility in accordance with an embodiment of the present invention will now be described with reference to FIGS. 3 to 7.

Figure 3:
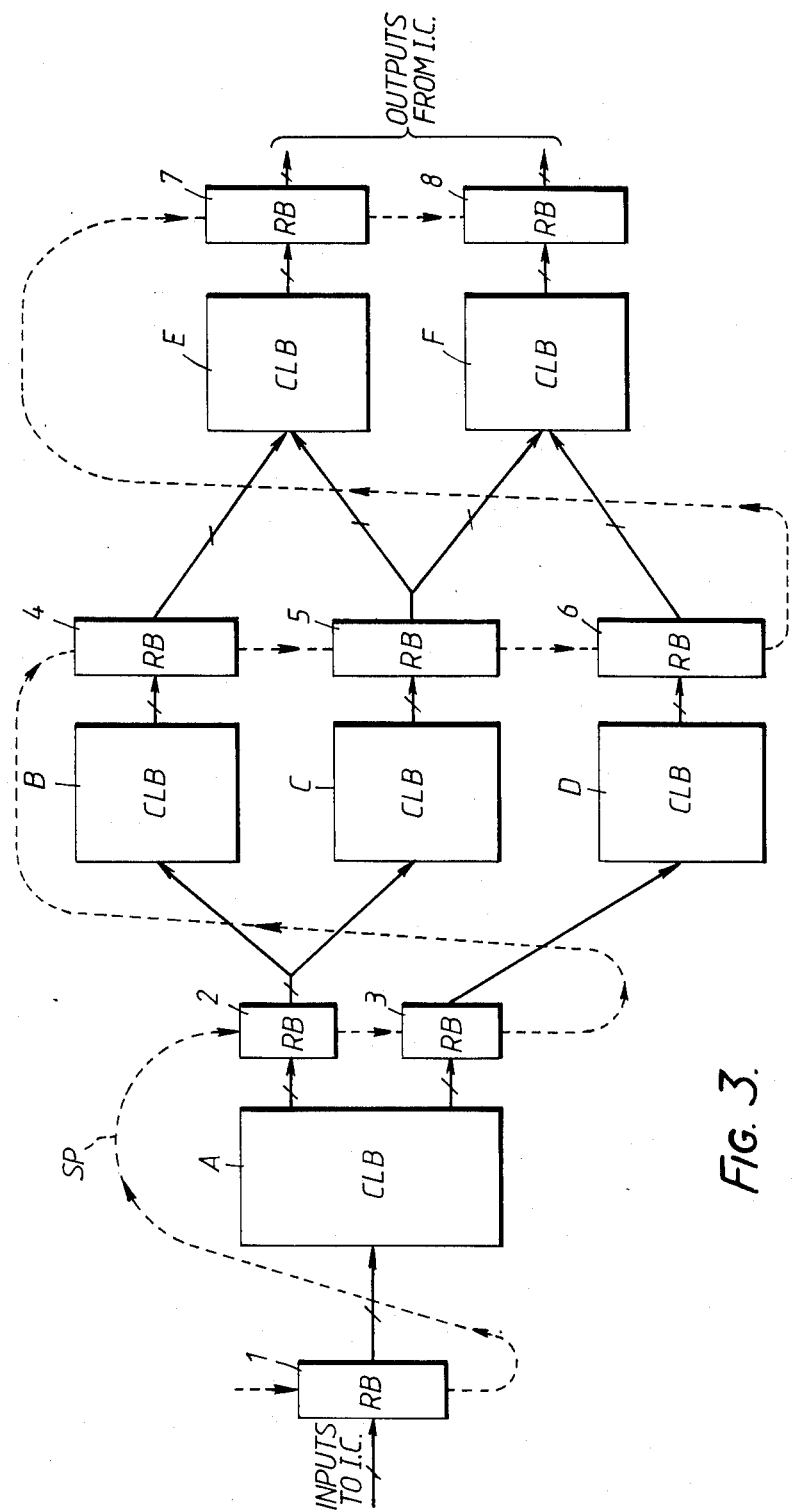
FIG. 3 is a block diagram of part of a circuit structure for an integrated circuit in accordance with an embodiment of the present invention.

An integrated circuit may be designed as a partitioned circuit but if it is not so designed a decision must be taken on the most suitable manner of partitioning the circuit into smaller sub-circuits. The partitioning is illustrated in FIG. 3 in which each sub-circuit comprises an asynchronous combinatorial logic block A, B, C, D, E, F whose outputs are connected to one or more register elements or flip-flop elements 2 to 8. The inputs to the integrated circuit in FIG. 3 are fed via another register or flip-flop element 1 to the inputs of the combinatorial loqic block A. The outputs from the register or flip-flop elements 7 and 8 are the output lines from the integrated circuit.

The register of flip-flop elements 2 to 8 are arranged in series such that their SCAN OUTPUT is connectible to the SCAN INPUT of the next element in the series. The SCAN OUTPUT of the integrated circuit is the final output of the element 8 and therefore appears on an output pin. The scan path defined by the elements is illustrated schematically by the dotted line SP in FIG. 3.

Examples of combinatorial logic blocks include random logic or logic arrays or read only memories or arithmetic and logic units or Multipliers or any element having a direct mapping of its input to its output. For ease of reference the "combinatorial logic block" will hereafter in the description be abbreviated to "CLB" and the register or flip-flop elements will hereafter in the description be abbreviated to "RB" standing for "register block". Each sub-circuit can be described as a "CLB-RB" unit. The method of designing a large integrated circuit is therefore to partition the circuit into several "CLB-RB" units, with the inputs of any "CLB-RB" units which are connected to the input of the overall integrated circuit preceeded by a further RB (RB "1" for example in FIG. 3). Each CLB has its inputs connected to at least one RB, has its outputs connected to at least one RB, and the output of the overall integrated circuit is taken from one or more RBs.

As every CLB input and output has at least one RB connected to it, the RBs can be configured to both generate exhaustive pseudo-random sequences to excite a CLB connected to the RBs outputs, and analyse the result of passing pseudo-random sequences through a CLB connected to the RBs inputs.

Figure 4A:
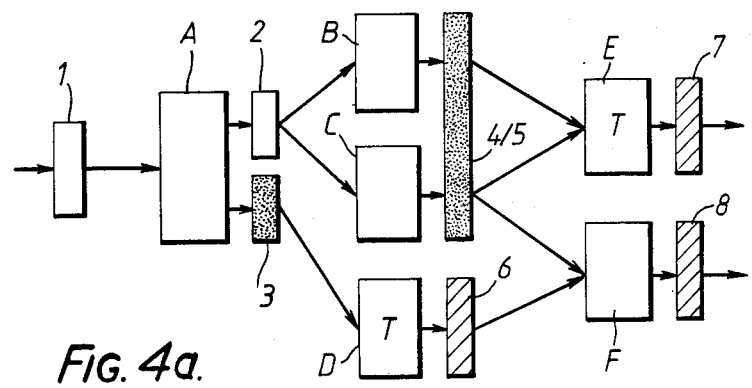
FIGS. 4a, 4b and 4c are illustrations of three possible test phases for the integrated circuit of FIG. 3.
Figure 4B:
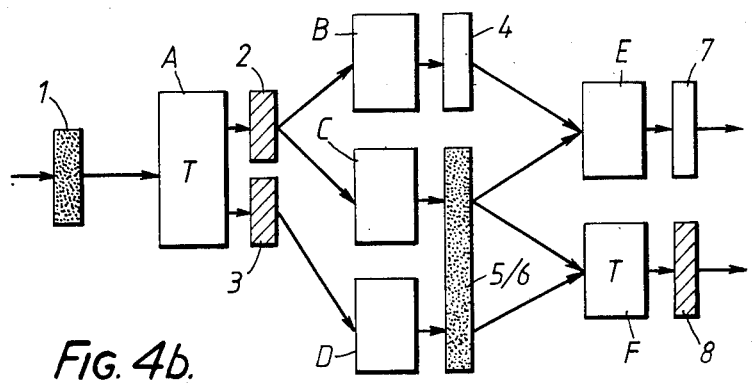
Figure 4C:
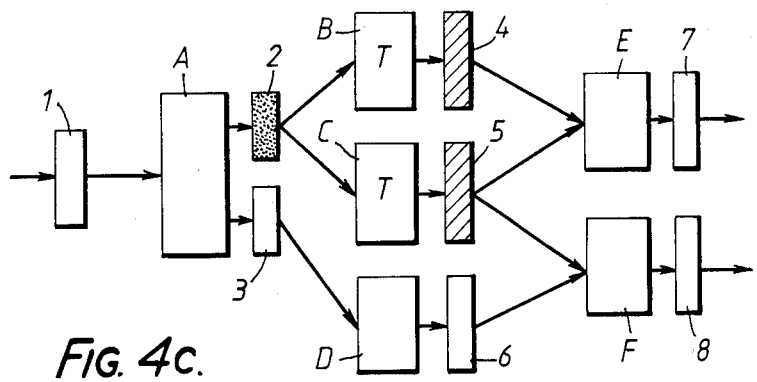

The integrated circuit designed in the form of the partitioned sub-circuits of FIG. 3 may be tested by executing three test phases sequentially as for example illustrated diagrammatically in FIGS. 4a, 4b and 4c.

During the first test phase, shown in FIG. 4a, the two CLB's "D" and "E" are under test, their test condition being indicated by the letter T shown in their blocks. To carry out a test on CLB "D" it is necessary to operate RB3 into its test pattern generator mode and to operate RB6 into its signature analyser mode. To test CLB "E" simultaneously with the test undertaken on CLB "D" it is also necessary to configure both of the RB's 4 and 5 so that they act together as a test pattern generator, and to operate RB7 in its signature analyser mode. After a sufficient number of clock cycles each of the RB's 6 and 7 contains a signature indicative of the functional characteristics of the respective CLB's "D" and "E". The signatures are indicative of whether or not the CLB's "D" and "E" are functioning correctly.

These signatures are serially shifted via the scan path SB and compressed in RB8. This is accomplished by operating the RB's 1,2,3,4,5,6 and 7 in scan path mode and operating RB8 in a serial signature analyser mode. This operation will hereinafter be referred to as a serial dump or serial dumping.

During the second test phase, shown in FIG. 4b, the two CLB's "A" and "F" are under test simultaneously. The test requires RB1 as well as the combined pair of RB5 and RB6 to be stimulated into their test pattern generator mode, whilst RB2, RB3 and RB8 are operated simultaneously in their signature analyser mode. The signature of CLB "A" is received by RB2 and RB3 and the signature of CLB "F" is received by RB8. The resulting signature is then serially dumped as described above and the signature now in RB8 is characterised by the final signatures of test phases 1 and 2.

During the third test phase, shown in FIG. 4c, the two CLB's "B" and "C" are under test simultaneously. To carry out the test RB2 alone is stimulated into its test pattern generator mode whilst RB4 and RB5 serve as the respective signature analysers. The signatures in RB4 and RB5 are serially dumped in the same manner as described above in test phases one and two. After this final serial dumping operation of the signatures of each of the six CLB's have been compressed together in RB8 and this signature is then compared with a known good signature expected if the six CLBs are functioning correctly. The comparison of the signatures is carried out by equipment external to the integrated circuit. In this way a fault in one or more of the CLBs or in their associated RBs is identified, the test being an exhaustive test on the integrated circuit in the sense that all irredundant elements of the integrated circuit and the connections between those elements have been tested.

Alternative techniques may be adopted for testing the integrated circuit of FIG. 3. For example the technique could include a test phase involving configuring the three RBs 4, 5 and 6 to form a single test pattern generator to test both CLBs "E" and "F" during a single test phase, the RBs 7 and 8 being set in their signature analyser mode. This alternative technique is less desirable in that a greater number of inputs to CLBs and RBs need to be stimulated and this may hinder or make impracticable an exhaustive sequence test of the CLB's "E" and "F".

The manner of carrying out the sequence of testing modes as described with reference to FIG. 3 and the design features required in the integrated circuit will now be described with reference to FIGS. 5, 6 and 7.

Figure 5:
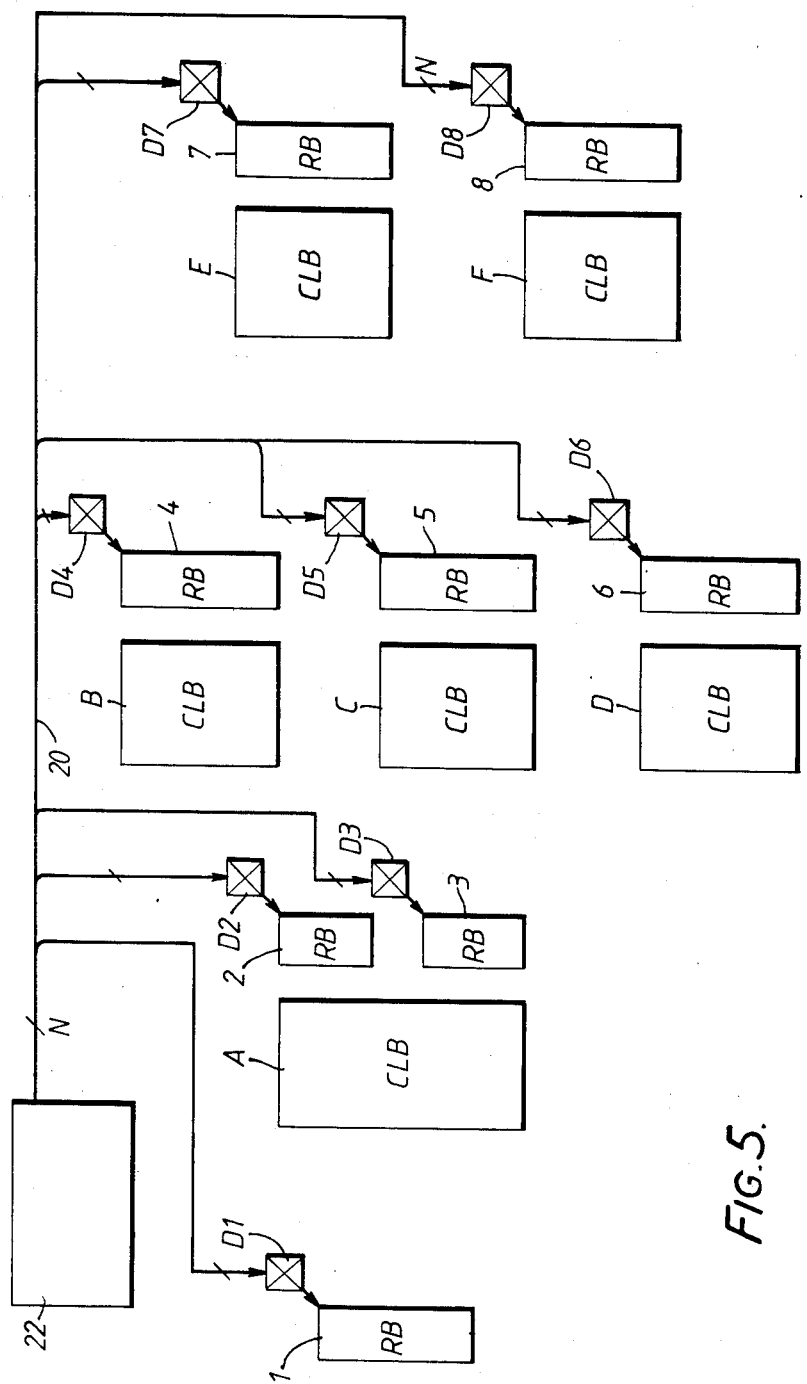
FIG. 5 is a block diagram of the integrated circuit of FIG. 3 incorporating features for executing the test phases of FIGS. 4a, 4b and 4c.
Figure 6D:
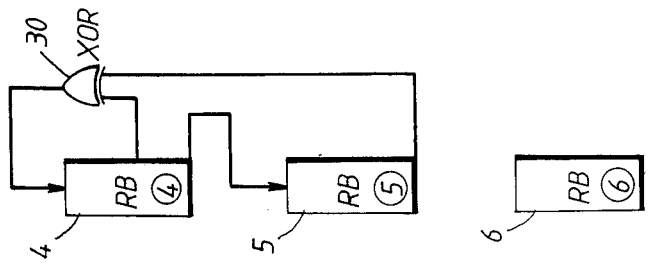
FIGS. 6a, 6b, 6c and 6d are schematic diagrams of feedback networks for use with three of the registers of FIG. 5; and, FIG. 7 is a schematic circuit diagram illustrating a method by which the feedback networks of FIGS. 6a, 6b, 6c and 6d are selected in accordance with the embodiment of FIG. 5 and FIGS. 6a, 6b, 6c and 6d.
Figure 6C:
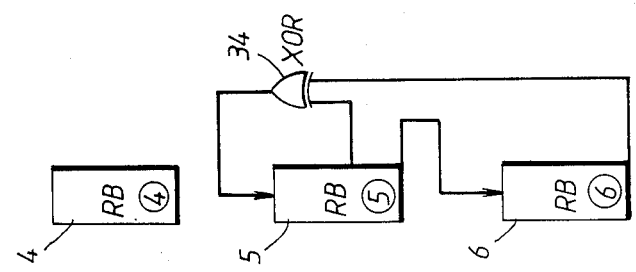
Figure 6B:
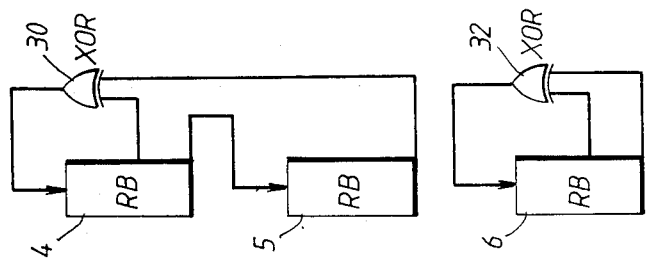

Referring to FIG. 5 each RB is coupled to a respective local test decoder D1, D2, D3, D4, D5, D6, D7 and D8. Each of the local test decoders are connected in parallel via a test bus 20 to a test controller 22. In operation each local test decoder is responsive to a predetermined test signal fed via the test bus 20 from the test controller to control the functional mode of the associated RB. The functional mode or state of the RB may be a test pattern generator mode, parallel signature analyser mode, normal register operation mode or scan path mode. In a preferred embodiment the local test decoders and the test controller 22 are an integral part of the integrated circuit design.

To carry out the test phases of FIG. 4 the state of each RB as determined by the signals in the test bus 20, and as configured by the associated local test decoder, follow the sequence in Table 1 in which TPG represents the test pattern generator mode; SA represents the signature analysis mode; SM represents the scan mode, SSA represents the serial signature analyser mode and N represents the normal register mode. Immediately prior to TEST PHASE NO. 1 all of the RB's are initialised to a known state. During the sequence of testing the RB's 1 to 7 are re-initiallised either immediately after or during each SERIAL DUMP. Thus the RB's 1 to 7 are re-initiallised prior to TEST PHASE NO. 2, and TEST PHASE NO. 3.

TABLE 1

| REGISTER BLOCK | RB1 | RB2 | RB3 | RB4 | RB5 | RB6 | RB7 | RB8 |
|---|---|---|---|---|---|---|---|---|
| TEST PHASE NO 1 | — | — | TPG | TPG | TPG | SA | SA | — |
| SERIAL DUMP | SM | SM | SM | SM | SM | SM | SM | SSA |
| TEST PHASE NO 2 | TPG | SA | SA | — | TPG | TPG | — | SA |
| SERIAL DUMP | SM | SM | SM | SM | SM | SM | SM | SSA |
| TEST PHASE NO 3 | — | TPG | — | SA | SA | — | — | — |
| SERIAL DUMP | SM | SM | SM | SM | SM | SM | SM | SSA |
| NORMAL OPERATION | N | N | N | N | N | N | N | N |

The functional partitioning of the circuit into CLB-RB units does not necessarily ensure isolation of the functions of each of the CLB-RB units when the circuit is in self-test mode. It is therefore necessary to consider the circuit as a whole when considering the self test. It is not sufficient to simply configure each RB as a simple BILBO register without also considering whether the register generates and analyses a long enough sequence and whether or not the register drives a CLB which also has inputs driven by other RBs.

In both cases, it becomes necessary to form a RB for test purposes out of combinations of RBs that are normally considered separate. Thus, for example, one may need a way of joining up separate RBs to form a single (long) shift register structure for test purposes. Furthermore, different phases of self-test may need a different grouping of RBs to form a different self-test function. The technique found to be the most efficient for achieving this is to identify those registers that both are driven by the same CLB and themselves drive the same combination of CLBs, and group all such registers together. The reason for doing this is that all registers in such a group are always required to take part in a shift register structure together. The serial input to each such group may have to be connected to one of a number of different register or feedback logic outputs in order to form the appropriate shift register structure for each test phase.

One example of the various feedback networks used to form the appropriate maximum length linear feedback shift registers during the test pattern generation and signature analysis is illustrated in FIGS. 6a, 6b, 6c and 6d for the RBs 4, 5 and 6.

Figure 6A:
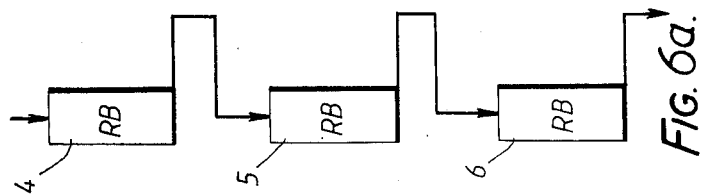
Figure 7:
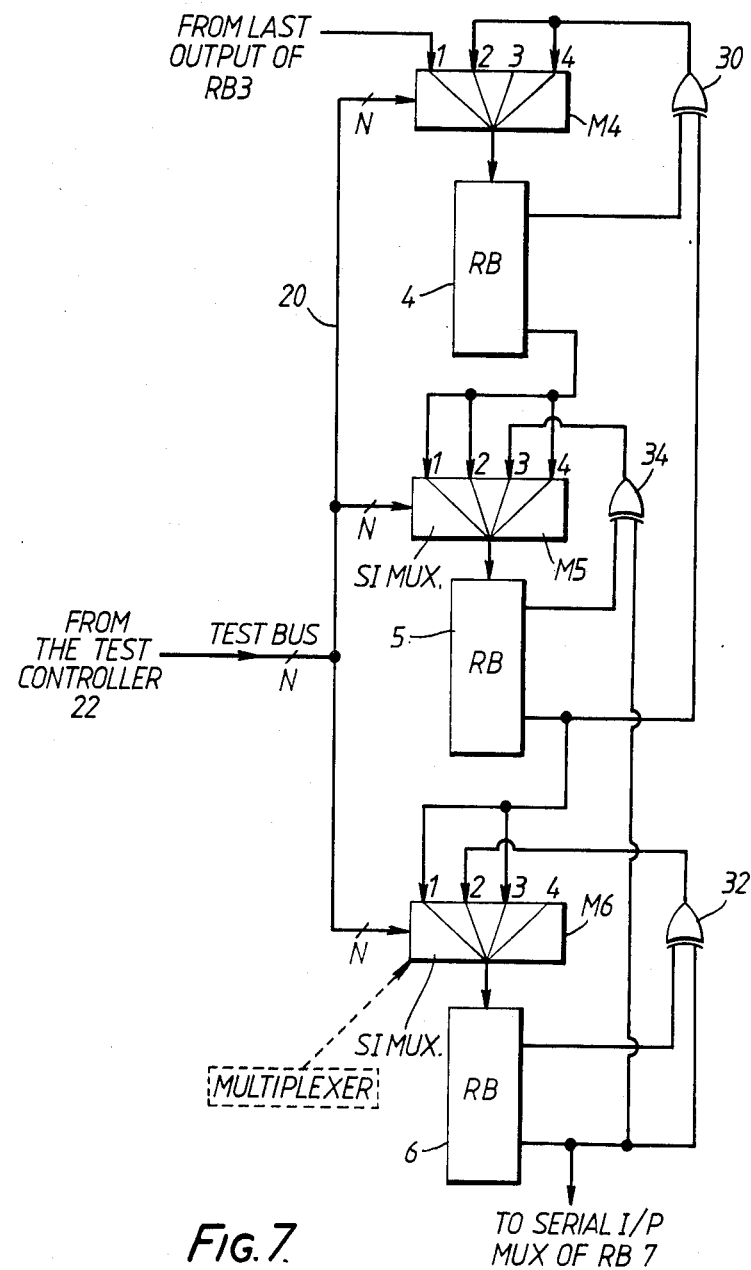

FIG. 6a illustrates the electrical configuration required when the RBs 4, 5, 6 are stimulated into their scan path mode. The SCAN input of RB4 being connected to the SCAN output of RB3 and the SCAN output of RB6 being connected to the SCAN input of RB7. This provides the scan path facility necessary to move signatures to the output pins of the integrated circuit after each of the test phases.

FIG. 6b illustrates the feedback configuration required during the first test phase during which RB4 and RB5 are required to serve together as a test pattern generator and RB6 serves as a signature analyser. For these purposes Exclusive-OR gates 30, 32 are provided in the respective feedback loops.

FIG. 6c illustrates the feedback configuration required during the second test phase when there is a need to combine RB5 and RB6 together as a test pattern generator. The feedback loop between RB6 and RB5 includes an Exclusive-OR gate 34. During the second test phase RB4 does not function as either a test pattern generator or a signature analyser.

FIG. 6d illustrates the feedback configuration required during the third test phase in which it is necessary to form RB4 and RB5 as signature analysers. It is convenient to configure RB4 and RB5 together as a single signature analyser in order that the feedback network of FIG. 6b can be utilised. During the third test phase RB6 does not serve a function.

In order to provide the configurations illustrated in FIGS. 6a, 6b, 6c and 6d a respective multiplexer is provided on the serial input of each RB. The multiplexers are illustrated in FIG. 7 and have been designated M4, M5 and M6.

The input selected by the multiplexer is decided by the command signals at its select input which is connected to the test bus 20. If it is desired for example to arrange RBs 4, 5 and 6 in their scan path mode the multiplexer M4 selects the last output of RB3 and the multiplexers M5 and M6 selects the outputs of RB4 and RB5 respectively. This is illustrated as input 1 on each of the multiplexers in FIG. 7. Similarly if it is desired to arrange RBs 4, 5 and 6 for operation in each of the first, second and third test modes then the multiplexers select respectively inputs 2, 3 and 4.

The method of self-testing an integrated circuit as described above in accordance with the present invention enables all but one possible test pattern to be applied to each combinatorial logic circuit. To reduce the time necessary for the test to an acceptable time requires that each combinatorial logic circuit has only a limited number of inputs. We have found for example that the number of inputs to each combinatorial logic circuit should be desirably chosen to be less than $\log_2 (T \times F)$ where T is the maximum available time for testing and F is the applied clock frequency.

It will be appreciated that although the register blocks are described above in FIGS. 6 and 7 by way of example as constructed as BILBO registers without the linear feedback Exclusive-OR gate 10 and the multiplexer MUX as shown in FIG. 1a, the construction of the register blocks may take a variety of forms using different arrangements of flip-flops and logic gates. For example we have found that faster input to output delay times may be provided by replacing one or more of the Exclusive OR gates 4, 10, 14, 30, 32 and 34 by Exclusive NOR gates. Furthermore Exclusive NOR gates are more convenient when resetting each functional element.

It will be appreciated that in preferred embodiments of the present invention it is preferable to construct the integrated circuit such that the whole of the integrated circuit can be self tested. It is to be understood, however, that the present invention also includes within its scope embodiments in which a substantial part, as opposed to the whole, of the integrated circuit can be self tested.

In different embodiments of the present invention the functional mode of each RB is selectively controlled by either a decoder means which is responsive to signals from the test controller or is selectively controlled directly from the test controller. The test controller and/or the decoder means may be formed as an integral part of the integrated circuit design or may be external to the integrated circuit.

It will be understood to the man skilled in the art that any logic block which can be preloaded, either before or during the testing operation, so as to establish a direct mapping of at least some of its input to its output can then also be treated as a combinatorial logic block for the purposes of the present invention.

We claim:

1. An integrated circuit having a built-in self test design, the integrated circuit comprising a plurality of combinatorial logic circuits coupled to a plurality of functional elements, wherein the improvement lies in that an input of at least one of the combinatorial logic circuits is connected to outputs of two or more of the functional elements and an output of at least one of the functional elements is connected to inputs of two or more of the combinatorial logic circuits, and, the functional elements are responsive to signals for selectively controlling functinal modes of each functional element and for selectively controlling predefined groups of functional elements to operate in different functional modes to effect test operations to the combinatorial logic circuits, means being provided for selecting different configurations for the functional elements for different stages of a self test to the integrated circuit, said means comprising feedback means provided between two or more of the functinal elements and data selecting means for selectively connecting the input of at least one of the functional elements to the feedback means or to another of the functional elements.

2. An integrated circuit as claimed in claim 1 wherein the integrated circuit is partitioned into two or more sub circuits, each sub-circuit comprising at least one combinatorial logic circuit and at least one functional element, the sub-circuits being arranged so that each combinatorial logic circuit has coupled to its input at least one functional element, the arrangement being such that a functional element which is coupled to both the input of one combinatorial logic circuit and to an output of a second combinatorial logic circuit has its functional mode controllable selectively to generate when required a pattern sequence of signals to the input of said one combinatorial logic circuit and to analyse when required the output from said second combinatorial logic circuit consequent upon a pattern sequence of signals being fed to the input of said second combinatorial logic circuit.

3. An integrated circuit as claimed in claim 2 wherein one or more of the sub-circuits is provided with an additional functional element an output of which is coupled to the input or inputs of the combinatorial logic circuit or circuits in said one or more sub-circuits, an input of the additional functional element being coupled to an input of the integrated circuit.

4. An integrated circuit as claimed in claim 2 wherein the sub-circuits are coupled together in a manner to allow simultaneous testing of two or more of the combinatorial logic circuits.

5. An integrated circuit having a built-in self test design, the integrated circuit comprising a plurality of sub-circuits each of which comprises at least one combinatorial logic circuit coupled to at least one functional element, wherein the improvement lies in that an input of at least one of the combinatorial logic circuits is connected to outputs of two or more of the functional elements and an output of at least one of the functional elements is connected to inputs of two or more of the combinatorial logic circuits, and the functional elements are responsive to signals for selectively controlling simultaneously two of more of the functional elements into different functional modes to effect a test phase to part of the integrated circuit, means being provided for effecting sequentially a plurality of such test phases to parts of the integrated circuit to provide test data representative of functional characteristics of substantially all the combinatorial logic circuits and functional elements in the integrated circuit, said menas comprising feedback means provided between two or more of the functional elements and data selecting means for selectively connecting the input of at least one of the functional elements to the feedback means or to another of the functional elements.

6. An integrated circuit as claimed in claim 1 wherein the functional mode of each functional element is selectively controlled by signals from decoder means which is responsive to signals from a test controller.

7. An integrated circuit as claimed in claim 1 wherein the functional mode of each functional element is selectively controlled directly by signals from a test controller.

8. An integrated circuit as claimed in claim 6 wherein the decoder means is an integral part of an integrated circuit design.

9. An integrated circuit as claimed in claim 6 wherein the decoder means is not an integral part of an integrated circuit design.

10. An integrated circuit as claimed in claim 6 wherein the test controller forms an integral part of an integrated circuit design.

11. An integrated circuit as claimed in claim 6 wherein the test controller is not an integral part of an integrated circuit design.

12. An integrated circuit as claimed in claim 6 wherein the decoder means comprises a plurality of test signal decoders each of which is coupled to a respective functional element or a respective group of functional elements, each test signal decoder being responsive to a predetermined sequence of input signals from the test controller for controlling the functional modes of the functional element or group of functional elements.

13. An integrated circuit as claimed in claim 12 wherein the test signal decoders are connected in parallel via a test bus to the test controller.

14. An integrated circuit as claimed in claim 1 wherein each functional element comprise flip-flops arranged together to define a shift register.

15. An integrated circuit as claimed in claim 1 wherein a number of inputs to each combinatorial logic circuit is less than $\log_2 (T \times F)$ where T is a maximum available time for testing and F is an applied clock frequency.

16. An integrated circuit as claimed in claim 1 wherein means are provided for feeding signals indicative of a functional characteristics of the combinatorial logic circuits to an output of the integrated circuit, said means feeding the signals to the output of the integrated circuit via a data route which passes through all of the functional elements.

17. An integrated circuit as claimed in cliam 1 wherein the feedback means includes an Exclusive NOR gate.

* * * * *